United States Patent
Katano et al.

(10) Patent No.: US 7,932,221 B2
(45) Date of Patent: Apr. 26, 2011

(54) SOLVENT FOR CLEANING

(75) Inventors: Akira Katano, Kawasaki (JP); Tetsuya Kato, Kawasaki (JP); Koji Harada, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 633 days.

(21) Appl. No.: 11/573,839

(22) PCT Filed: Jul. 7, 2005

(86) PCT No.: PCT/JP2005/012574
§ 371 (c)(1), (2), (4) Date: Feb. 16, 2007

(87) PCT Pub. No.: WO2006/018940
PCT Pub. Date: Feb. 23, 2006

(65) Prior Publication Data
US 2008/0039355 A1    Feb. 14, 2008

(30) Foreign Application Priority Data

Aug. 20, 2004  (JP) ................................. 2004-241617
Apr. 28, 2005  (JP) ................................. 2005-132036

(51) Int. Cl.
  *C11D 7/50*  (2006.01)
(52) U.S. Cl. ........................................ 510/175; 134/1.3
(58) Field of Classification Search .................. 510/175; 134/1.3
  See application file for complete search history.

(56) References Cited

U.S. PATENT DOCUMENTS

| 4,956,115 | A | * | 9/1990 | Van De Mark | ............... 510/206 |
| 6,048,368 | A | | 4/2000 | Tcheou et al. | |
| 6,265,116 | B1 | | 7/2001 | Uchikawa et al. | |
| 2002/0005503 | A1 | | 1/2002 | Driessche et al. | |
| 2003/0071010 | A1 | | 4/2003 | Schwartzkopf | |
| 2007/0161530 | A1 | * | 7/2007 | Kaneda et al. | ............... 510/176 |
| 2008/0167210 | A1 | * | 7/2008 | Kaneda et al. | ............... 510/176 |

FOREIGN PATENT DOCUMENTS

| JP | 05-259066 | 8/1993 |
| JP | 09-269410 | 10/1997 |
| JP | 10-090516 | 4/1998 |
| JP | 10-221843 | 8/1998 |
| JP | 11-084125 | 3/1999 |
| JP | 2000-273370 | 10/2000 |
| JP | 2001-188364 | 7/2001 |
| JP | 2002-141265 | 5/2002 |
| JP | 2003-171694 | 6/2003 |
| JP | T-2003-525221 | 8/2003 |
| JP | 2004-069754 | 3/2004 |
| WO | WO 2005059646 | 6/2005 |

OTHER PUBLICATIONS

Archer, W. L.1996 Hansen Solubility Parameters of Solvents. *Industrial Solvents Handbook*, pp. 35-47.
Whim, B. P., et al. 1996 Solvent Action and Measurement. *Directory of Solvents*, pp. 22-29.
International Search Report from PCT/JP2005/012574 dated Sep. 27, 2005.
Notice of Submission of Publish Documents issued on Apr. 10, 2007, on counterpart Japanese Patent Application No. 2005-132036.
Office Action issued in related Japanese Patent Application No. 2005-132036, dated Nov. 21, 2006.

* cited by examiner

*Primary Examiner* — Gregory E Webb
(74) *Attorney, Agent, or Firm* — Knobbe, Martens, Olson & Bear LLP

(57) ABSTRACT

A solvent for cleaning that offers particularly superior results for cleaning pigment-dispersed photosensitive resin compositions used for forming color filters and black matrix patterns. The solvent for cleaning has a hydrogen bonding parameter ($\delta_H$) among the Hansen solubility parameters that falls within a range from 5 to 10.

19 Claims, No Drawings

SOLVENT FOR CLEANING

RELATED APPLICATIONS

This application is the U.S. National Phase filing under 35 U.S.C. §371 of PCT/JP2005/012574, filed Jul. 7, 2005, which designated the United States and was published in a language other than English, which claims priority under 35 U.S.C. §119(a)-(d) to Japanese Patent Application No. 2004-241617, filed Aug. 20, 2004, and Japanese Patent Application No. 2005-132036, filed Apr. 28, 2005. The content of these applications is incorporated herein by reference in their entireties.

TECHNICAL FIELD

The present invention relates to a solvent for cleaning a photosensitive resin composition.

BACKGROUND ART

Photolithography techniques are used in the production of semiconductor elements and liquid crystal display elements, and these techniques use positive and negative photosensitive resin compositions.

These photosensitive resin compositions are applied, in the form of a coating liquid, to a substrate such as a semiconductor substrate or glass substrate, are subsequently subjected to a suitable drying treatment to form a coating, and are then selectively exposed and then subjected to developing treatment, thereby forming a patterned photosensitive resin coating.

The method used for applying the photosensitive resin composition to the substrate is typically a spin coating method, although in the field of liquid crystal display element production, where the displays continue to increase in size, coating techniques such as coat and spin methods and non-spin methods are starting to be proposed.

In the coating process, the nozzle from which the photosensitive resin composition is discharged, the internal walls of the coating apparatus, the peripheral edge of the substrate, the underside of the substrate, and other piping systems and the like become soiled with the photosensitive resin composition, and consequently a cleaning treatment must be conducted, either periodically or as required.

Particularly in the case of materials containing dispersed pigments, such as the pigment-dispersed photosensitive resin compositions used for forming color filters and black matrix patterns, cleaning and removal is problematic, and the development of a cleaning liquid that exhibits superior cleaning performance has been keenly sought.

Examples of conventional cleaning liquids for pigment-dispersed photosensitive resin compositions include those disclosed in patent references 1 and 2.

[Patent Reference 1]
Japanese Unexamined Patent Application, First Publication No. 2001-188364
[Patent Reference 2]
Japanese Unexamined Patent Application, First Publication No. 2000-273370

DISCLOSURE OF INVENTION

Problems to be Solved by the Invention

However, as a result of increases in substrate size and new proposals for coating devices, the cleaning area is increasing in size, meaning further improvements in the cleaning performance are required.

The present invention has an object of providing a cleaning solvent that is ideal for cleaning this type of photosensitive resin composition, and offers particularly superior results for cleaning pigment-dispersed photosensitive resin compositions used for forming color filters and black matrix patterns.

Means for Solving the Problems

In order to achieve the above object, the present invention adopts the aspect described below.

The present invention provides a solvent for cleaning a photosensitive resin composition, wherein the hydrogen bonding parameter ($\delta_H$) among the Hansen solubility parameters is within a range from 5 to 10.

Effects of the Invention

By adopting the present invention, a solvent for cleaning that exhibits excellent cleaning performance is provided.

BEST MODE FOR CARRYING OUT THE INVENTION

As follows is a more detailed description of the present invention.

<<Photosensitive Resin Composition>>

There are no particular restrictions on the photosensitive resin composition that represents the cleaning target in the present invention, and any of the positive, negative, chemically amplified, or non-chemically amplified photosensitive resin compositions that have been used for semiconductors, liquid crystals, or color filters or the like can be used.

The photosensitive resin composition basically includes a resin component and a photosensitive component such as a photopolymerization initiator as its essential components. In addition, the composition may also contain monomer components, surfactants, acid components, nitrogen-containing organic compounds, pigments, and solvents and the like.

Photosensitive resin compositions for which the cleaning effect is particularly superior include photosensitive resin compositions with pigments dispersed therein, and particularly photosensitive resin compositions for forming red (R), green (G), and blue (B) color filters, and photosensitive resin compositions for forming black matrix patterns.

Examples of the above resin component include copolymers formed from one or more monomers containing a carboxyl group such as acrylic acid and methacrylic acid, and one or more monomers selected from amongst methyl acrylate, methyl methacrylate, ethyl acrylate, ethyl methacrylate, 2-hydroxyethyl acrylate, 2-hydroxyethyl methacrylate, 2-hydroxypropyl methacrylate, N-butyl acrylate, N-butyl methacrylate, isobutyl acrylate, isobutyl methacrylate, benzyl acrylate, benzyl methacrylate, phenoxy acrylate, phenoxy methacrylate, isobornyl acrylate, isobornyl methacrylate, glycidyl methacrylate, styrene, acrylamide, and acrylonitrile and the like; as well as phenol novolak epoxy acrylate copolymers, phenol novolak epoxy methacrylate copolymers, cresol novolak epoxy acrylate copolymers, cresol novolak epoxy methacrylate copolymers, bisphenol A epoxy acrylate copolymers, and bisphenol S epoxy acrylate copolymers.

Examples of the aforementioned photopolymerization initiator include 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethan-1-one, bis(4- dimethylaminophenyl)ketone, 2-methyl-1-[4-(methylthio) phenyl]-2-morpholinopropan-1-one, 2-benzyl-2-dimethylamino-1-(4-morpholinophenyl)-butan-1-one, 2,4,6-trimethylbenzoyldiphenylphosphine oxide, 4-benzoyl-4'-methyldimethylsulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethyl acetal, benzyl dimethyl ketal, 1-phenyl-1,2-propanedione-2-(o-ethoxycarbonyl)oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene peroxide, 2-mercaptobenzimidazole, 2-mercaptobenzoxazole, 2-mercaptobenzothiazole, 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzil, benzoin, benzoin methyl ether, benzoin ethyl ether, benzoin isopropyl ether, benzoin n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl 4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, and 2,4-bis-trichloromethyl-6-(2-bromo-4-methoxy)styrylphenyl-s-triazine.

Examples of the aforementioned pigment include C.I. Pigment Yellow 11, 24, 31, 53, 83, 99, 108, 109, 139, 150, 151, 154, 167, 180, 185, and 193; C.I. Pigment Orange 36, 38, and 43; C.I. Pigment Red 105, 122, 149, 150, 155, 171, 175, 176, 177, 209, 224, 254, and 264; C.I. Pigment Violet 19, 23, 32, and 39; C.I. Pigment Blue 1, 2, 15:1, 15:2, 15:3, 16, 22, 60, and 66; C.I. Pigment Green 7, 36, and 37; C.I. Pigment Brown 25 and 28; and C.I. Pigment Black 1 and 7 and carbon black.

Many of these photosensitive resin compositions for forming color filters or black matrix patterns have already been proposed, and examples of preferred materials include the photosensitive materials disclosed in Japanese Unexamined Patent Application, First Publication No. 2004-69754, Japanese Unexamined Patent Application, First Publication No. Hei 11-231523, Japanese Unexamined Patent Application, First Publication No. Hei 11-84125, Japanese Unexamined Patent Application, First Publication No. Hei 10-221843, Japanese Unexamined Patent Application, First Publication No. Hei 9-269410, and Japanese Unexamined Patent Application, First Publication No. Hei 10-90516.

<Solvent for Cleaning>

The present invention provides a solvent for cleaning, wherein the hydrogen bonding parameter ($\delta_H$) among the Hansen solubility parameters is within a range from 5 to 10.

The Hansen solubility parameters are one method of defining the solubility parameters of a solvent, and are disclosed and defined, for example, in "Industrial Solvents Handbook" (pp. 35 to 68, published by Marcel Dekker, Inc., 1996) and in "Directory of Solvents" (pp. 22 to 29, published by Blackie Academic & Professional, 1996).

By either selecting a solvent for which the hydrogen bonding parameter ($\delta_H$) among the Hansen solubility parameters is within a range from 5 to 10, and preferably from 6 to 8, or using a mixed solvent that has been prepared by combining a plurality of solvents so that, for the mixed solvent, the hydrogen bonding parameter ($\delta_H$) among the Hansen solubility parameters is within a range from 5 to 10, and preferably from 6 to 8, a cleaning solvent that exhibits excellent cleaning performance can be obtained.

If the hydrogen bonding parameter is smaller than the lower limit of the above range, then the capability of the solvent in removing the organic components within the photosensitive resin composition such as the resin component, monomer components, and photopolymerization initiator and the like is poor, whereas if the hydrogen bonding parameter exceeds the upper limit of the above range, then those components such as pigments that are dispersed rather than dissolved in the photosensitive resin composition tend to become prone to aggregation and the like, and may remain following cleaning.

The solvent for cleaning may employ either a single solvent, which is selected so that the aforementioned hydrogen bonding parameter ($\delta_H$) falls within the range from 5 to 10, and preferably from 6 to 8, or a mixed solvent that contains a combination of a plurality of solvents. From the viewpoint of the cleaning performance, a mixed solvent is preferred.

In the case of a mixed solvent, the hydrogen bonding parameter following mixing must fall within the range described above. For example, solvents that each have a hydrogen bonding parameter ($\delta_H$) within the above range may be mixed together, or solvents from within the above range may be mixed with solvents from outside the range.

The hydrogen bonding parameter ($\delta_H$) of a mixed solvent can be assigned a value that is determined theoretically using the following equation.

$$\text{Hydrogen bonding parameter } (\delta_H) = A \times a + B \times b + C \times c + \ldots$$

(wherein, A, B, and C represent the hydrogen bonding parameters of each of the solvents within the mixed solvent, and a, b, and c represent the (weight-referenced) proportions of each of the solvents, wherein the weight of the entire mixed solvent is deemed to be 1).

For example, the hydrogen bonding parameter of propylene glycol monomethyl ether acetate is 6.6, the hydrogen bonding parameter of propylene glycol monomethyl ether is 13.6, and the hydrogen bonding parameter of xylene is 2.5, and consequently, the hydrogen bonding parameter of a mixed solvent containing these solvents mixed together in a weight ratio of 6:2:2 is calculated as: hydrogen bonding parameter=6.6×0.6+13.6×0.2+2.5×0.2=7.18.

The hydrogen bonding parameters for the various solvents can use the values disclosed in "Industrial Solvents Handbook" (pp. 35 to 68, published by Marcel Dekker, Inc., 1996).

Of the various possibilities, solvents for cleaning that contain a propylene glycol monoalkyl ether acetate are preferred as a result of their effectiveness in removing organic components within photosensitive resin compositions.

Examples of propylene glycol monoalkyl ether acetates include those solvents containing a straight-chain or branched-chain alkyl group of 1 to 3 carbon atoms, and propylene glycol monomethyl ether acetate (PGMEA) (hydrogen bonding parameter=6.6) is the most desirable.

Furthermore, in order to achieve faster drying characteristics, the use of a propylene glycol monoalkyl ether is preferred, and of the various possibilities, those compounds containing an alkyl group of 1 to 5 carbon atoms are preferred. Propylene glycol monomethyl ether (PGME) (hydrogen bonding parameter=13.6) is a particularly preferred solvent, and this solvent is preferably used by mixing with an aforementioned propylene glycol monoalkyl ether acetate, and particularly with PGMEA, to generate a mixed solvent with a hydrogen bonding parameter that falls within the range from 5 to 10.

Furthermore, for pigment-dispersed photosensitive resin compositions, and particularly for black pigment (carbon)-dispersed photosensitive resin compositions for forming black matrix patterns, the addition of an aromatic solvent suppresses the carbon aggregation phenomenon and is consequently preferred.

In order to prevent aggregation of the carbon particles, and ensure efficient dispersion, the use of an aromatic solvent that contains an alkyl group is particularly effective, and solvents such as monoalkylbenzenes, dialkylbenzenes, and trialkylbenzenes are preferred. The alkyl groups within these aromatic solvents preferably contain from 1 to 5 carbon atoms. Furthermore, the proportion of these aromatic solvents within the aforementioned solvent for cleaning is preferably at least 5% by weight.

Specific examples of these solvents include toluene (hydrogen bonding parameter=2.0), xylene (hydrogen bonding parameter=2.5), ethylbenzene (hydrogen bonding parameter=1.4), as well as propylbenzene, 1-methylpropylbenzene, 2-methylpropylbenzene, dimethylbenzene, diethylbenzene, ethylmethylbenzene, trimethylbenzene, and ethyldimethylbenzene, which have hydrogen bonding parameters within a range from 1.4 to 3.1.

Aromatic solvents that include both a dialkylbenzene and a trialkylbenzene are particularly desirable. These solvents are preferably combined appropriately with the aforementioned propylene glycol monoalkyl ether acetate and/or the propylene glycol monoalkyl ether, and the proportions adjusted to generate a mixed solvent with a hydrogen bonding parameter within the range from 5 to 10.

Examples of aromatic solvents that include both a dialkylbenzene and a trialkylbenzene include the commercially available solvents SOLVESSO 100, SOLVESSO 150, and SOLVESSO 200 (all product names, manufactured by Exxon Mobil Corporation). Because these products are petroleum distillates, quantifying the aromatic compounds contained within the products is difficult. For example, Solvesso 100 contains ethylmethylbenzene, methylpropylbenzene, diethylbenzene, trimethylbenzene, and ethyldimethylbenzene.

Anisole (methoxybenzene) (hydrogen bonding parameter=6.7) and the like may also be used as the aromatic solvent.

As described above, a 3-component mixed solvent containing a propylene glycol monoalkyl ether acetate, a propylene glycol monoalkyl ether, and an aromatic solvent is the most preferred option for cleaning and removing pigment-dispersed photosensitive resin compositions. There are no particular restrictions on the mixing proportions of these components, which can be adjusted appropriately so that the hydrogen bonding parameter of the mixed solvent falls within the range from 5 to 10. The mixing proportions are preferably such that propylene glycol monoalkyl ether acetate:propylene glycol monoalkyl ether:aromatic solvent=1 to 9:0.1 to 3:1 (weight ratio), and even more preferably 2 to 4:0.5 to 1.5:1 (weight ratio).

A solvent for cleaning according to the present invention preferably includes a good solvent with respect to the resin component of the photosensitive resin composition. Examples of this good solvent include the types of solvents used in forming the photosensitive resin composition.

Here, the term "resin component" refers to the aforementioned resin component that is known as a structural component of photosensitive resin compositions for forming color filters and photosensitive resin compositions for forming black matrix patterns. Particularly in those cases where the resin component contained within the photosensitive resin composition that represents the cleaning target is known in advance, the solvent used within that photosensitive resin composition is preferably included within the cleaning solvent.

Specific examples of good solvents for the resin component of the photosensitive resin composition include ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclohexanone, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, ethyl-3-propoxypropionate, propyl-3-methoxypropionate, isopropyl-3-methoxypropionate, ethyl ethoxyacetate, ethyl oxyacetate, methyl 2-hydroxy-3-methylbutanoate, propyl acetate, butyl acetate, isoamyl acetate, ethyl carbonate, propyl carbonate, butyl carbonate, methyl pyruvate, ethyl pyruvate, propyl pyruvate, butyl pyruvate, methyl acetoacetate, ethyl acetoacetate, methyl lactate, ethyl lactate, butyl lactate, ethylhexyl lactate, benzyl methyl ether, benzyl ethyl ether, dihexyl ether, benzyl acetate, ethyl benzoate, diethyl oxalate, diethyl maleate, γ-butyrolactone, benzene, toluene, xylene, cyclohexanone, butanol, 3-methyl-3-methoxybutanol, hexanol, cyclohexanol, ethylene glycol, diethylene glycol, and glycerol. The most preferred of these solvents include the aforementioned propylene glycol monoalkyl ether acetates and propylene glycol monoalkyl ethers.

<Surfactant>

A surfactant is preferably added to a solvent for cleaning of the present invention. A solvent for cleaning according to the present invention is deemed to include not only so-called solvents (either single solvents or mixed solvents), but also cleaning compositions containing a solvent and one or more other components.

Examples of the above surfactant include the types of surfactants already known as components of photosensitive resin compositions for forming color filters and photosensitive resin compositions for forming black matrix patterns, and in those cases where the surfactant within the photosensitive resin composition that represents the cleaning target is known in advance, the same type of surfactant is preferably used.

Examples of suitable surfactants include fluorine-silicon-based surfactants. Of these, nonionic fluorine-silicon-based surfactants (E-1) having a perfluoroalkyl ester group, an alkylsiloxane group, an ethyleneoxy group and a propyleneoxy group bonded thereto are preferred. Specific examples include MEGAFAC R-08 and R-60 (product names, manufactured by Dainippon Ink and Chemicals, Incorporated).

Furthermore, surfactant components (E-2) in which the fluorine content is within a range from 10 to 25% by weight and the silicon content is within a range from 3 to 10% by weight are also preferred. Specific examples include X-70-090, X-70-091, X-70-092 and X-70-093 (product names, manufactured by Shin-Etsu Chemical Co., Ltd.).

Furthermore, polyester-modified polydialkylsiloxane-based surfactants (E-3) having a specific siloxane skeleton are also preferred. Specific examples include BYK-310 and BYK-315 (products manufactured by BYK Chemie GmbH).

Specific examples of surfactants besides the surfactants (E-1) to (E-3) described above include fluorine-based surfactants such as FLUORAD FC-430 and FC-431 (product names, manufactured by Sumitomo 3M Ltd.), and EFTOP EF122A, EF122B, EF122C and EF126 (product names, manufactured by Tohkem Products Corporation).

Either a single surfactant may be used alone, or a combination of two or more different surfactants may be used.

The quantity of the surfactant within a solvent for cleaning according to the present invention is preferably sufficient to produce a surfactant concentration within the composition that falls within a range from 0.0001 to 1.0% by weight, and even more preferably from 0.001 to 1.0% by weight.

Provided the blend quantity of the surfactant is at least as large as the lower limit of the above range, the effects of adding the surfactant can be satisfactorily realized. Furthermore, by ensuring that the quantity is no greater than the upper limit of the above range, the surfactant concentration within the photosensitive resin composition can be prevented from becoming overly high when residual cleaning liquid left after cleaning makes contact with the photosensitive resin composition. If the surfactant concentration within the photosensitive resin composition is too high, then the likelihood of bubbles forming increases, which actually increases the chance of coating irregularities and may also cause pinhole generation within the coating film.

Furthermore, if the surfactant concentration within the photosensitive resin composition that represents the cleaning target is known in advance, then setting the surfactant concentration within the cleaning solvent to approximately the same concentration level is preferred in terms of balancing the surface free energy.

A solvent for cleaning according to the present invention can be used not only for removing unneeded photosensitive resin composition from a substrate following application of the composition to the substrate, but can also be used favorably for cleaning photosensitive resin composition that has adhered to nozzles, rollers, or piping or the like within the coating apparatus used in the coating process.

According to the present invention, a solvent for cleaning is obtained that exhibits excellent cleaning performance for photosensitive resin compositions.

A solvent for cleaning according to the present invention has particularly superior cleaning performance for pigment-dispersed photosensitive resin compositions used for forming color filters or black matrix patterns.

Although a solvent for cleaning of the present invention may be formed from a single solvent, in order to satisfy various characteristics including the cleaning performance, drying performance, and the ability to prevent precipitation of cleaned pigments, mixed solvents formed using a plurality of solvents are preferred as they enable more ready design of cleaning liquids with favorably balanced properties.

According to a solvent for cleaning of the present invention wherein the hydrogen bonding parameter $(\delta_H)$ falls within the range described above, favorable cleaning performance is obtained, including favorable removal of components within the photosensitive resin composition such as the resin component, monomer components, and photopolymerization initiator, as well as good suppression of the aggregation of pigments and the like.

On the other hand, according to a solvent for cleaning that includes a good solvent with respect to the resin component of the photosensitive resin composition, aggregation of pigment particles such as carbon dispersed within the photosensitive resin composition is removed by the solvent is suppressed, and the pigments are dispersed efficiently within the cleaning solvent. In other words, if the dispersibility of the pigments within the solvent for cleaning is poor, then pigment particles that have been cleaned off the substrate undergo aggregation and are prone to precipitating out on the cleaned surface, but the above solvent for cleaning prevents this phenomenon and minimizes cleaning residues.

The use of an aromatic solvent is particularly preferred in terms of inhibiting aggregation and precipitation of carbon. Inclusion of an aromatic solvent containing an alkyl group and/or alkoxy group enables carbon to be dispersed particularly efficiently, and is consequently preferred.

It is thought that the reason for this observation is that the π electrons of the aromatic ring contribute to the affinity for carbon, whereas the alkyl group and/or alkoxy group contribute to improved affinity with good solvents for the resin component of the photosensitive resin composition, and as a result, a favorable level of affinity is obtained between the solvent for cleaning and carbon.

Accordingly, such cleaning solvents are particularly effective for black pigment (particularly carbon)-dispersed photosensitive resin compositions used for forming black matrix patterns.

Furthermore, when the tip of a discharge nozzle is cleaned, if the cleaning liquid remains adhered to the nozzle and the like, then when discharge of the photosensitive resin composition is re-commenced following completion of the cleaning, the cleaning liquid adhered to the nozzle and the like blends with the photosensitive resin composition, causing a change in the makeup of the photosensitive resin composition. There is a danger that such changes can lead to a deterioration in characteristics such as the coating properties of the photosensitive resin composition, and may cause coating irregularities and the like. Particularly in those cases where a surfactant is added to the photosensitive resin composition, contact with the cleaning liquid can lead to a reduction in the surfactant concentration, making the composition more prone to coating irregularities.

According to the present invention, a solvent for cleaning that exhibits excellent drying performance (namely, fast drying) can be provided, and consequently, blending of the cleaning liquid into the photosensitive resin composition can be suppressed. Including a propylene glycol monoalkyl ether is particularly effective in improving the drying performance of the solvent.

In addition, by using a solvent for cleaning that also contains a surfactant, reductions in the surfactant concentration within the photosensitive resin composition can be suppressed, even if residual cleaning liquid is incorporated into the photosensitive resin composition, thus enabling the occurrence of coating irregularities to be prevented.

EXAMPLES

As follows is a description of examples of the present invention, although the scope of the present invention is in no way limited by these examples.

Evaluations of the various characteristics within the following examples and comparative examples were conducted in accordance with the evaluation methods described below.
(Evaluation of Drying Performance)

This is expressed as a relative drying time compared with PGMEA. Specifically, in an air-conditioned chamber in which the air temperature was 23±1° C., the humidity was 45±5% and the pressure was 760±10 mmHg, a 1 g sample (of cleaning liquid) was dripped onto the central region of the surface of a 3-inch silicon wafer using a polyethylene dropper, and the drying time (X seconds), determined by observing the sample (the cleaning liquid) visually while the sample was spun on a spin coater at a speed of 2,000 rpm, was divided by the drying time (Y seconds) for the case in which PGMEA was used as the sample, thereby yielding a numerical value.
(Evaluation of Cleaning Performance)

A photosensitive resin composition for forming a black matrix pattern "CFPR BK-5005SL" (a product name, manufactured by Tokyo Ohka Kogyo Co., Ltd.) was adhered to the inside of a 1 milliliter glass pipette. Subsequently, the inside of the pipette was subjected to 10 cleaning treatments using 1 ml samples of the cleaning solvent, and the cleanliness of the pipette was then determined by visual inspection. Those examples in which absolutely no cleaning residue remained were evaluated as A, examples in which a small quantity of cleaning residue was visible, but at a level that would present no practical problems, were evaluated as B, and examples in which a large quantity of cleaning residue was present, at a level likely to cause practical problems, were evaluated as C.
(Evaluation of Pigment Precipitation)

A tubular glass vessel with a diameter of 12 mm and a length of 1,000 mm was filled with a mixed liquid containing CFPR-BK-5005SL/cleaning liquid=1/9 (weight ratio), and with the vessel standing still in a vertical arrangement, 10 ml samples were withdrawn from the upper layer portion and the lower layer portion respectively of the liquid, and these samples were then coated onto glass substrates and analyzed visually for the presence of pigment aggregation using an optical microscope. Samples for which aggregation and precipitation was considerable, and of a level that would cause practical problems, were evaluated as C, samples which revealed some aggregation and precipitation but at a level that would present no practical problems were evaluated as B, and samples which revealed no aggregation or precipitation were evaluated as A.

(Evaluation of Coating Irregularities)

Using the same method as that described above for the evaluation of pigment precipitation, 10 ml samples were collected from the upper layer portion and the lower layer portion, and these samples were spin coated onto substrates and inspected visually for coating irregularities. Samples with no coating irregularities were evaluated as A, samples with some coating irregularities but at a level that would present no practical problems were evaluated as B, and samples with a level of coating irregularities that would cause practical problems were evaluated as C.

Example 1

A cleaning liquid was prepared from PGMEA (hydrogen bonding parameter=6.6).

Example 2

A mixed cleaning liquid (hydrogen bonding parameter=8.7) containing PGMEA:PGME=7:3 (weight ratio) was prepared.

Example 3

A mixed cleaning liquid (hydrogen bonding parameter=7.1) containing PGMEA:PGME:SOLVESSO 100=6:2:2 (weight ratio) was prepared.

Example 4

A cleaning liquid was prepared by adding 50 ppm of a surfactant (product name: ADDITOL XL 121, manufactured by Solutia Inc.) to the cleaning liquid of the example 3.

Example 5

A mixed cleaning liquid (hydrogen bonding parameter=7.56) containing anisole:toluene:PGMEA:PGME=2:1:5:2 (weight ratio) was prepared.

Example 6

A cleaning liquid was prepared by adding 50 ppm of a surfactant (product name: ADDITOL XL 121, manufactured by Solutia Inc.) to the cleaning liquid of the example 5.

Comparative Example 1

SOLVESSO 100 (hydrogen bonding parameter=2) was used as the cleaning liquid.

Comparative Example 2

N,N-dimethylacetamide (hydrogen bonding parameter=10.2) was used as the cleaning liquid.

Comparative Example 3

PGME (hydrogen bonding parameter=13.6) was used as the cleaning liquid.

The cleaning liquids from each of the examples and comparative examples described above were evaluated for drying performance, cleaning performance, pigment precipitation, and coating irregularities. The results are shown below in Table 1.

TABLE 1

| | Hydrogen bonding parameter | Surfactant | Drying performance | Cleaning performance | Aggregation and precipitation of pigment | Coating irregularities |
|---|---|---|---|---|---|---|
| Example 1 | 6.6 | No | 1 | B | B | B |
| Example 2 | 8.7 | No | 0.9 | B | B | B |
| Example 3 | 7.1 | No | 1 | A | A | B |
| Example 4 | 7.1 | Yes | 1 | A | A | A |
| Example 5 | 7.56 | No | 1 | A | A | B |
| Example 6 | 7.56 | Yes | 1 | A | A | A |
| Comparative example 1 | 2.0 | No | 1.2 | C | C | C |
| Comparative example 2 | 10.2 | No | >6 | C | C | C |
| Comparative example 3 | 13.6 | No | 0.9 | B | C | C |

As is evident from the above results, the solvents for cleaning (cleaning liquids) of the examples 1 through 6 provided favorable levels of drying performance and cleaning performance, with no practical problems.

The examples 3 through 6 that included an aromatic solvent yielded particularly favorable results with no pigment aggregation or precipitation.

Furthermore, the examples 4 and 6 that included an added surfactant provided particularly favorable results with no coating irregularities.

The invention claimed is:

1. A solvent for removing a photosensitive resin composition, comprising an aromatic solvent, a propylene glycol monoalkyl ether acetate, and a propylene glycol monoalkyl ether, wherein a hydrogen boding parameter ($\delta_H$) among Hansen solubility parameters of the solvent for removing a photosensitive resin composition is within a range from 5 to 10, and wherein
said aromatic solvent is a mixture of anisole and at least one selected from the group consisting of toluene, xylene and ethylbenzene.

2. The solvent for removing a photosensitive resin composition according to claim 1, wherein said photosensitive resin composition is a composition that comprises a pigment.

3. The solvent for removing a photosensitive resin composition according to claim 1, wherein said photosensitive resin composition is a photosensitive resin composition for forming a red, (R), green (G), or blue (B) color filter.

4. The solvent for removing a photosensitive resin composition according to claim 1, wherein said photosensitive resin composition is a photosensitive resin composition for forming a black matrix protein.

5. The solvent for removing a photosensitive resin composition according to claim 1, wherein said solvent comprises a surfactant.

6. A method of removing a photosensitive resin composition, comprising contacting said photosensitive resin composition with a solvent having a hydrogen bonding parameter ($\delta_H$) among Hansen solubility parameters that is within a range from 5 to 10 wherein
said solvent comprises an aromatic solvent, a propylene glycol monoalkyl ether acetate, and a propylene glycol monoalkyl ether; and
said aromatic solvent is a mixture of anisole and at least one selected from the group consisting of toluene, xylene and ethylbenzene.

7. The method according to claim 6, wherein said photosensitive resin composition is a composition that comprises a pigment.

8. The method according to claim 6, wherein said photosensitive resin composition is a photosensitive resin composition for forming a red (R), green (G), or blue (B) color filter.

9. The method according to claim 6, wherein said photosensitive resin composition is a photosensitive resin composition for forming a black matrix pattern.

10. The method according to claim 6, wherein said solvent comprises a surfactant.

11. The solvent according to claim 1, wherein the mixing proportion of propylene glycol monoalkyl ether acetate:propylene glycol monoalkyl ether:aromatic solvent is 1 to 9:0.1 to 3:1 (weight ratio).

12. A method of manufacturing the solvent for removing a photosensitive resin composition of claim 1, comprising admixing the propylene glycol monoalkyl ether acetate, propylene glycol monoalkyl ether, and an aromatic solvent.

13. The method according to claim 12, wherein said photosensitive resin composition comprises a pigment.

14. The method according to claim 12, wherein said photosensitive resin composition is a photosensitive resin composition for forming a red (R), green (G), or blue (B) color filter.

15. The method according to claim 12, wherein said photosensitive resin composition is a photosensitive resin composition for forming a black matrix protein.

16. The solvent according to claim 12, wherein said solvent for removing a photosensitive resin composition comprises a surfactant.

17. The method of claim 12, wherein the mixing portions are adjusted such that propylene glycol monoalkyl ether acetate:propylene glycol monoalkyl ether:an aromatic solvent is 1 to 9:0.1 to 3:1 (weight ratio).

18. The method of claim 12, wherein a hydrogen bonding parameter among Hansen ($\delta_H$) among Hansen solubility parameters is within a range from 5 to 10.

19. The method of claim 12, wherein said aromatic solvent is a mixture of anisole and at least one selected from the group consisting of toluene, xylene and ethylbenzene.

* * * * *